(12) United States Patent
Walsh et al.

(10) Patent No.: US 10,172,256 B2
(45) Date of Patent: Jan. 1, 2019

(54) MULTI-WAY OPENING PANEL FOR AN ELECTRONICS RACK WITH ELECTRONICALLY CONTROLLED HINGE

(71) Applicant: Middle Atlantic Products, Inc., Fairfield, NJ (US)

(72) Inventors: Brendan K. Walsh, Belvidere, NJ (US); Nico Corbo, Blairstown, NJ (US); Andrew Glendmyer, Haskell, NJ (US)

(73) Assignee: Middle Atlantic Products, Inc., Fairfield, NJ (US)

( * ) Notice: Subject to any disclaimer, the term of this patent is extended or adjusted under 35 U.S.C. 154(b) by 0 days.

(21) Appl. No.: 15/977,783

(22) Filed: May 11, 2018

(65) Prior Publication Data

US 2018/0352674 A1  Dec. 6, 2018

Related U.S. Application Data

(60) Provisional application No. 62/514,129, filed on Jun. 2, 2017.

(51) Int. Cl.
| | |
|---|---|
| *G06F 1/16* | (2006.01) |
| *H05K 5/00* | (2006.01) |
| *H05K 7/00* | (2006.01) |
| *H05K 7/18* | (2006.01) |
| *H05K 5/02* | (2006.01) |
| *H05K 7/14* | (2006.01) |

(52) U.S. Cl.
CPC ............. *H05K 7/18* (2013.01); *H05K 5/0217* (2013.01); *H05K 7/1492* (2013.01)

(58) Field of Classification Search
CPC ........ H05K 7/18; H05K 7/183; H05K 5/0217; H05K 5/0226; H05K 5/0221; H05K 5/0247; H05K 7/1492; H05K 7/1485; H05K 7/1487; H05K 7/1488
USPC ....... 361/679.01, 724–727; 312/223.1–223.3
See application file for complete search history.

(56) References Cited

U.S. PATENT DOCUMENTS

| | | | |
|---|---|---|---|
| 5,001,602 A * | 3/1991 | Suffi | H04Q 1/028 361/724 |
| 6,445,585 B1 * | 9/2002 | Walker | H05K 5/0017 292/145 |
| 7,518,876 B1 * | 4/2009 | Schmidt | G06F 1/1622 248/917 |
| 8,283,576 B2 * | 10/2012 | Schell | H02B 1/36 174/32 |

(Continued)

*Primary Examiner* — Anthony Haughton
(74) *Attorney, Agent, or Firm* — Drinker Biddle & Reath LLP

(57) ABSTRACT

An electronics rack with an electrically controlled access panel, including an enclosure including a base, side walls and a top, with at least one opening in a sidewall or the top for accessing the interior of the enclosure. At least one panel is mounted to the enclosure for permitting controlled access to the interior. At least two electronically controlled hinges are mounted to opposite sides of the panel. Each hinge has a hinge axis about which the panel can rotate when the panel is unlocked, the hinge axes of the two hinges being parallel to one another. Each hinge includes a hinge pin that is slidable in a housing between a retracted position and an extended position. Each hinge includes an electronically controlled drive mechanism for controlling reciprocation of the hinge pin.

10 Claims, 3 Drawing Sheets

(56) References Cited

U.S. PATENT DOCUMENTS

| | | | | |
|---|---|---|---|---|
| 8,503,182 B2* | 8/2013 | Petrick | ................ | G06F 1/1626 312/223.1 |
| 2009/0277661 A1* | 11/2009 | Schell | .................... | H02B 1/36 174/50 |
| 2016/0192529 A1* | 6/2016 | Butterbaugh | ........ | H05K 7/1409 361/679.57 |

* cited by examiner

MULTI-WAY OPENING PANEL FOR AN ELECTRONICS RACK WITH ELECTRONICALLY CONTROLLED HINGE

RELATED APPLICATION

This application is related to and claims priority from U.S. Provisional Application 62/514,129, filed Jun. 2, 2017, the disclosure of which is incorporated herein by reference in its entirety.

FIELD OF THE INVENTION

The invention relates to an electronics rack enclosure and, more particularly, to a door or panel on an electronics rack which is electronically controlled and optionally transmits power, data and/or signals through the hinge.

BACKGROUND

In data centers and IT rooms, it is common to house multiple servers, such as blade servers, in an electronics rack. Most conventional electronics racks have vertical spacing of up to 42U, which can house as many as 42 separate servers. In many data centers, and even co-located IT rooms it is not uncommon for racks to contain servers for different companies. As such, it may be desirable to limit access to certain servers in a rack depending on the service technician accessing the rack.

Also, for racks that house audio/visual equipment, such as AV equipment in a school, it may be desirable to limit access for the users to a smaller portion of the rack.

Another problem the inventors have determined occurs when there are two racks located side-by-side and a technician needs to access both racks at the same time, such as when moving servers from one rack to another. In such cases, it would be beneficial to be able to control the doors so that they open on opposite hinges, e.g., the left rack door is hinged on the left side and the right rack door is hinged on the right side.

There is therefore a need for a pedestal with better access to internally mounted electronics.

SUMMARY OF THE INVENTION

An electronics rack is disclosed that includes an electrically controlled access panel. In one embodiment, the rack includes a base, at least four side walls and a top. The base, sidewalls and top defining an enclosure with an interior. The enclosure has at least one opening in at least one sidewall or the top for accessing the interior of the enclosure. At least four vertical supports are attached to and extend up from the base for supporting the side walls and the top. At least one panel is mounted to the enclosure for permitting controlled access to the interior of the enclosure.

At least two electronically controlled hinges are mounted to opposite sides of the panel. Each hinge has a hinge axis about which the panel can rotate when the hinge on the opposite side of the panel is unlocked, the hinge axes of the two hinges being parallel to one another. Each hinge includes a hinge pin that is slidable in a housing between a retracted position and an extended position. A portion of the hinge pin extends out of the housing and into a recess in a hinge cup in the extended position, and is substantially retracted into the housing and out of the recess in the hinge cup in the retracted position. The housing of each hinge is attached to one of either the panel or the enclosure and the hinge cup is mounted to the other of the panel or the enclosure. Each hinge further included an electronically controlled drive mechanism for controlling reciprocation of the hinge pin relative to the housing.

In an embodiment, when the hinge pins on the two hinges are in their extended position and in the recesses of the hinge cups, the panel cannot be rotated about either hinge axis, and when the hinge pin of one of the two hinges is in its retracted position and the hinge pin of the other of the two hinges is in its extended position, the panel can be rotated about the hinge axis of the hinge that has the hinge pin in its extended position.

The drive mechanism may be an electronically controlled solenoid mounted to the housing.

The panel may be a door on one of the sidewalls of the enclosure, or an access cover on the top.

An electronic control panel may be included and mounted on the enclosure and wired to the solenoids for controlling actuation of the solenoids.

It is also contemplated that a program application may be stored in memory (such as logic encoded in a non-transitory computer readable medium) of a computing device that is remotely located from the enclosure. The computing device preferably includes a processor, such as a microcontroller, digital signal processor or other processing component, for running the program application. The program application is configured to supply control signals, such as through a wireless transmitter, to a received in the control panel for sending signals to control the actuation of the solenoids.

The panel may include an electrical device mounted thereon which is configured to receive at least one type of electrical signal selected from a group including power, data and control signals. At least one of the hinges may be configured to transmit the at least one electrical signal from the hinge pin to the panel. The hinge may include a first electrical lead with a first end adapted to be connected to a source for supplying the electrical signal and a second end connected to a conductive surface on the hinge pin. A second electrical lead has a first end connected to a component of the hinge cup that is in contact with the conductive surface of the hinge pin when the hinge pin is in its extended position, and a second end connected to the electrical device.

In various embodiments at least two hinges may be configured to transmit the at least one electrical signal, and the electronics rack includes a switch for controlling the transmission of the electrical signals from the hinges to the electrical device.

In various embodiments, there may be multiple electrical devices on the panel and multiple hinges are configured to each transmit at least one electrical signal, such that each hinge is configured to transmit the signal to an associated electrical device.

In various embodiments, at least one hinges may be configured to transmit two or more electrical signals selected from a group including power, data and control signals, where the hinge pin includes a plurality of first electrical leads that extend through a portion of the hinge pin, each first electrical lead having an end that is attached to a band of conductive material on the surface of the hinge pin. Each conductive band is preferably separate from an adjacent conductive band by a non-conducting material. Each electrical lead is adapted to transmit one of the two or more electrical signals. The hinge cup may include a plurality of second electrical leads, each of the second electrical leads having a first end connected to a conductive material positioned within the hinge cup which is arranged to contact an associated one of the conductive surfaces of the hinge pin when the hinge pin is in its extended position.

In an embodiment an electronics rack is disclosed that includes an electrically controlled panel. The rack includes a base, at least four side walls and a top, the base, sidewalls and top defining an enclosure with an interior, the enclosure having at least one opening in at least one sidewall or the top for accessing the interior of the enclosure. There are at least four vertical supports attached to and extending up from the base for supporting the side walls and the top. At least one panel is mounted to the enclosure for permitting controlled access to the interior of the enclosure.

A plurality of electronically controlled hinges are provided, each hinge having an engaged state and a disengaged state. Each hinge is attached to the enclosure and the panel for securing the panel to the enclosure when the hinge is in its engaged state. At least two of the plurality of hinges are attached to opposites sides of the panel. Each hinge has a hinge axis about which the panel can rotate when the hinge is in its engaged state and the other hinge is in its disengaged state, the hinge axes of the at least two hinges being parallel to one another. Each hinge includes a hinge pin that reciprocates in a housing between a retracted position and an extended position. A portion of the hinge pin extends out of the housing and into a recess in a hinge cup in the extended position thereby defining the engaged state of the hinge. The portion of the hinge pin is retracted toward the housing and out of the recess in the hinge cup in the retracted position thereby defining the disengaged state of the hinge. The housing of each hinge is attached to one of either the panel or the enclosure and the hinge cup is mounted to the other of the panel or the enclosure. Each hinge further includes an electronically controlled solenoid mounted to the housing for controlling reciprocation of the hinge pin relative to the housing.

When the at least two hinges are in their engaged state the panel cannot be rotated about either hinge axis, and when one hinge of the at least two hinges is in its disengaged state and the other hinge of the at least two hinges is in its engaged position, the panel can be rotated about the hinge axis of the hinge that is in its engaged position.

An electronic control panel is mounted on the enclosure and wired to the solenoids for controlling actuation of the solenoids.

The foregoing and other features of the invention and advantages of the present invention will become more apparent in light of the following detailed description of the preferred embodiments, as illustrated in the accompanying figures. As will be realized, the invention is capable of modifications in various respects, all without departing from the invention. Accordingly, the drawings and the description are to be regarded as illustrative in nature, and not as restrictive.

BRIEF DESCRIPTION OF THE DRAWINGS

For the purpose of illustrating the invention, the drawings show a form of the invention which is presently preferred. However, it should be understood that this invention is not limited to the precise arrangements and instrumentalities shown in the drawings.

DESCRIPTION OF THE INVENTION

Figure 2:
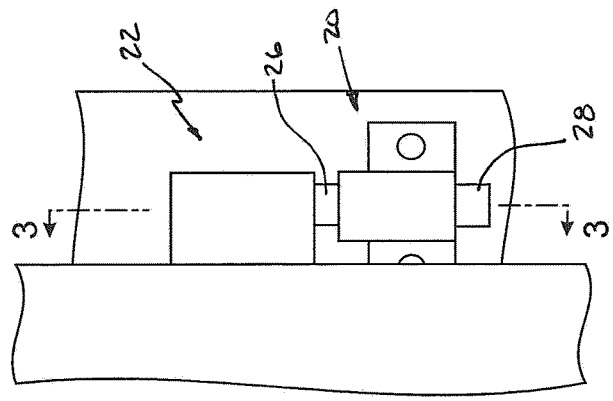
FIG. 2 is an enlarged view of the hinge of FIG. 1.
Figure 1:
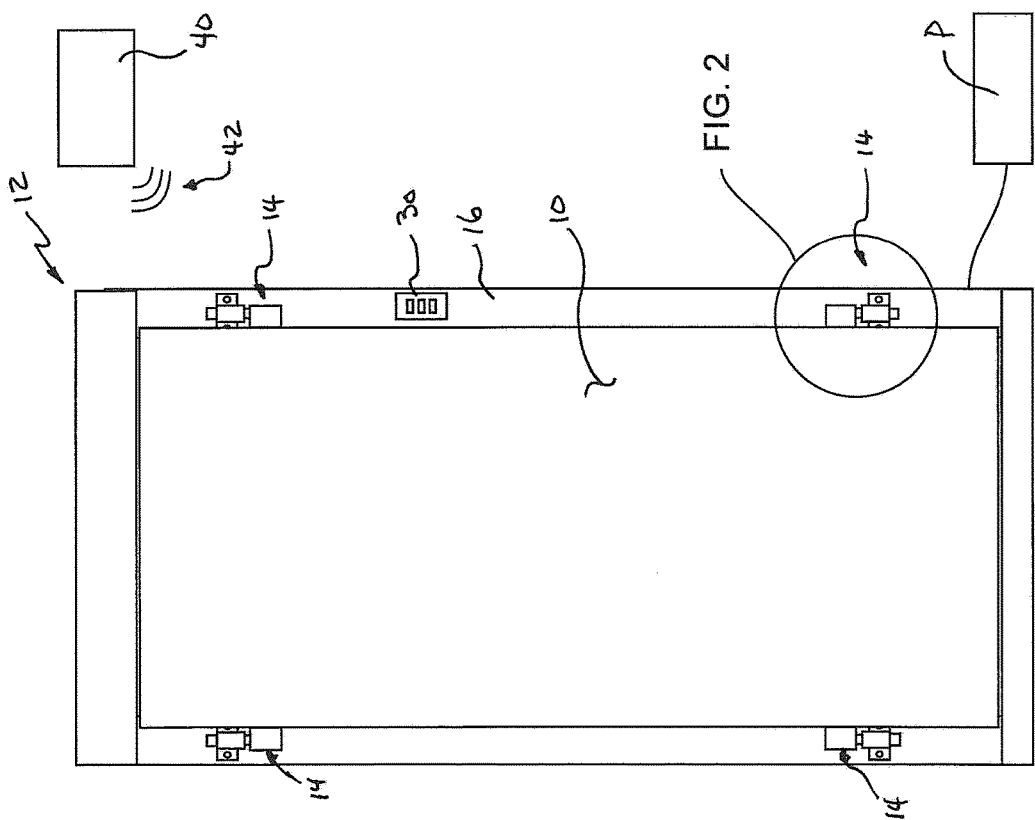
FIG. 1 is a front view of an electronics rack with a multi-way opening door/panel/cover mounted thereon.

The present invention is directed to a door, panel or cover 10 for an electronics rack 12 that is mounted so as to permit multi-directional opening of the door, panel or cover (i.e., opening of the door/panel/cover in the left or right, up or down directions). In one embodiment shown in FIGS. 1-3, a dual opening door is shown which is particularly useful for ganged racks, i.e., multiple side-by-side racks, that at times require accessing adjacent racks simultaneously. The present invention permits such access without the need for removing the doors. The door 10 is mounted to the rack 12 through a plurality of hinges 14 that are attached to the door and a vertical post 16 of the rack 12. As shown, there are hinges 14 on both lateral sides of the door 10.

Each hinge 14 is electronically controlled such that the hinge pin can be engaged or disengaged from hinge cup. In an embodiment, the electronically controlled hinge 14 includes a solenoid controlled hinge pin assembly 20 and a hinge cup 22. The hinge pin assembly 20 includes a pin housing 24 within which is reciprocally mounted a hinge pin 26. In an embodiment, a solenoid 28 controls the reciprocation of the hinge pin 26 into and out of the housing 24. The hinge cup 22 includes a recess 23 into which the hinge pin 26 can slide when it is extended from the housing 24.

A controller 30 controls the actuation of the solenoids 28. The controller 30 could be an electronic panel mounted on the rack that is wired to the solenoids 28. The controller 30 is preferably configured to provide at least the following control selections: (i) "open left side" (which sends commands to the hinges 14 on the left side of the door to cause the solenoids 28 to retract the hinge pins 26); (ii) "open right side" (which sends commands to the hinges 14 on the right side of the door to cause the solenoids 28 to retract the hinge pins 26); and (iii) "remove door" (which sends commands to all the hinges 14 to cause the solenoids 28 to retract the hinge pins 26).

In an embodiment, the controller 30 may in addition or in the alternative include a computer application 40 that can be stored on and run from a remote processing device, such as a laptop or a mobile smart phone. As with the controller 30 itself, the computer application 40 would provide the ability to send commands to the hinges 14 as set forth above (e.g., open left side, open right side, remove door). In this embodiment, if the remote device is not hard wired to the controller 30, the remote device includes a transmitter for sending the signals 42 (such as by wireless (WiFi) signals) and the controller 30 would include a receiver (such as a WiFi dongle) for receiving the signals. It is also contemplated that the rack may be an intelligent smart rack that includes suitable electrical communication components that permits wired communications through the internet. One suitable electronic control is the RackLink® control system available from Middle Atlantic Products, Inc., Fairfield, N.J.

Figure 4:
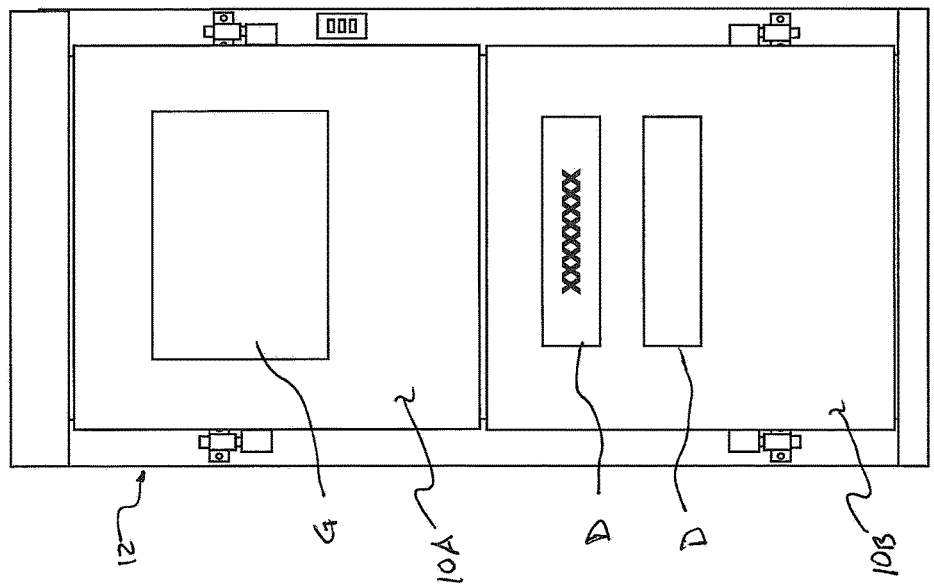
FIG. 4 is a front view of another electronics rack with a multi-way opening door/panel/cover mounted thereon.

In many situations it is desirable to have power supplied to the door 10 for use with various powered components, for example, door mount lights, external or internal displays D (FIG. 4), electronic glass G (i.e., glass where its transparency is controlled by electrical power, FIG. 4), etc. Since the present invention uses hinges on both sides of the door, hard wiring is not a viable option. Thus, in one embodiment, the present invention contemplates the use of a novel manner of supplying electrical signals, such as power, data or control signals, to the door.

Figure 3:
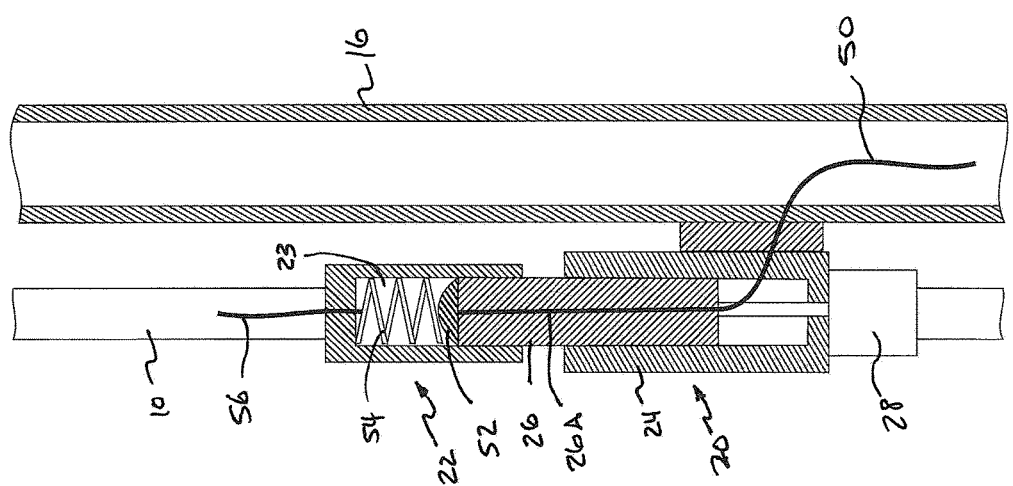
FIG. 3 is an enlarged cross-sectional view of the hinge of FIG. 2, taken along lines 3-3 in FIG. 2.

Referring to FIG. 3, one embodiment is shown which supplies one electrical signal, for example power, to the door. In this embodiment, a wire lead 50 extends from a power source P to the hinge pin 26. The hinge pin 26 is preferably made from a conductive material or, more preferably, includes a conductive trace or wire 26A that extends from the wire lead 50 to the tip 52 of the pin 26. A conductive spring 54 is located within the recess 23 and is electrically connected to a wire lead 56 that extends to the electrically powered component on the door.

As should be readily apparent, when the pin 26 is extended (i.e., the hinge is engaged), a conductive circuit is provided between the power source and the electrical/data component through the electrically controlled hinge pin 26 that supplies the additional control signal(s). When the hinge pin assembly 20 is disengaged, the pin 26 is retracted out of contact with the spring 54, thus stopping power supply to the door. If the electrical signal needs to be sent to the door only when it is closed, then only a signal hinge 14 needs to provide the electrical signal since it is not necessary to supply power when the door is open. If, however, it is desired that the electrical signals are continuous, then at least one hinge 14 on each side of the door 10 in the dual-directional opening door embodiment is configured to pass electrical signals to the door from the rack 12. The controller 30 would include programming to determine which of the two electronic signal transmitting hinges (e.g., the left or right hinge) should supply the signal to the door 10. When controller receives a command to unlock a hinge 14 that is transmitting electronic signals, for example, power, to the door, the controller redirects the electronic signals to the hinge that remains engaged before disengaging the hinge to be unlocked. Alternatively, the system could be configured to supply the power to hinges on both sides and a switch (not shown) included on the door to change from one lead 56 to the other when power is no longer supplied on one lead 56. When one of the two powered hinges 14 are retracted (i.e., one of the powered hinges 14 is disengaged for opening), the circuit on that side of the door 10 is broken, but the circuit on the other side remains intact, thus supplying power to the door 10. When all the hinges 14 are disengaged for removing the door 10, no power is supplied to the door 10.

Since there are four hinges in the illustrated embodiment, it is contemplated that the hinges may be used for supplying different signals for different tasks. For example, the lower hinges may be used for supplying power to an electrical component on the door, while the upper hinges may be used for supplying power to a second electrical component or, more preferably, for supplying data or control signals to an electrical component on the door, such as a display.

Figure 5:
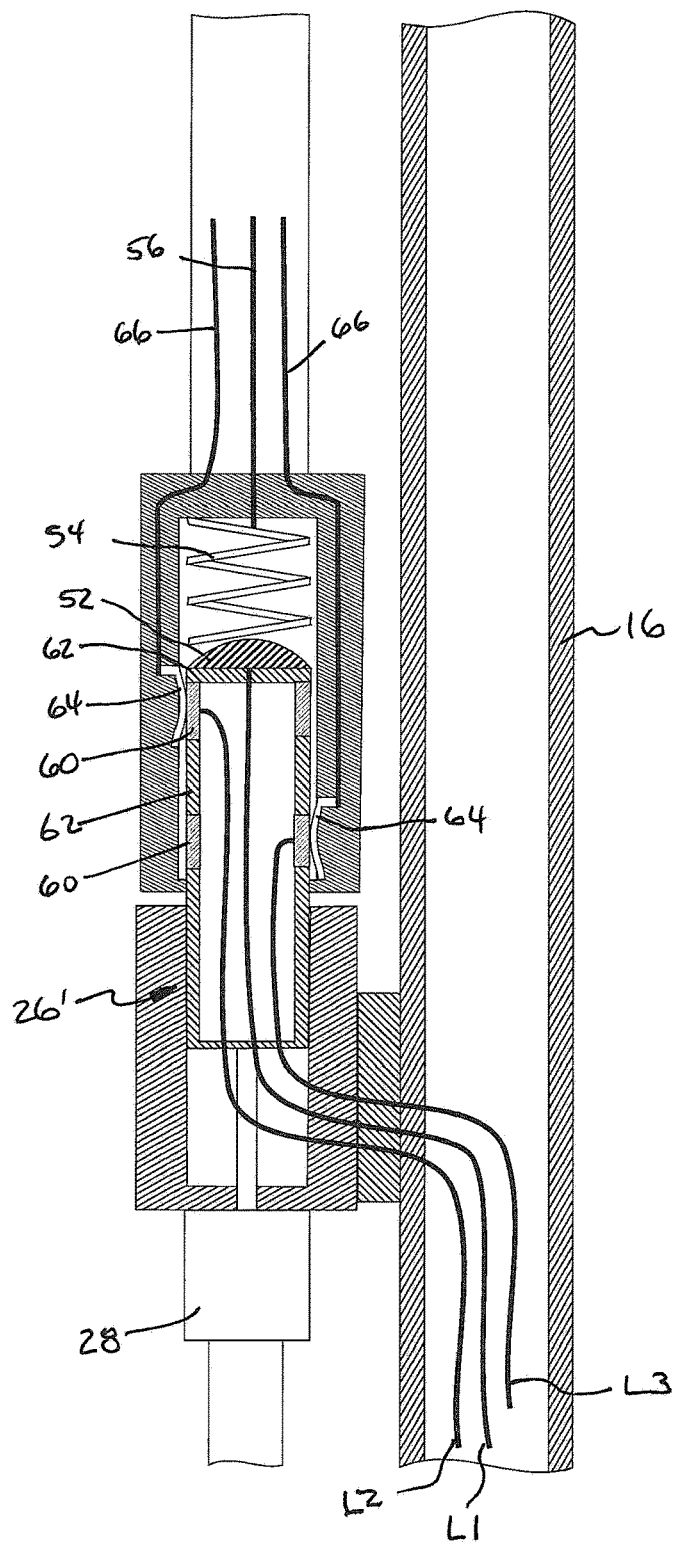
FIG. 5 is an enlarged cross-sectional view of the electronically controlled hinge of FIG. 2 with multiple conductors for supplying a plurality of electronic signals.

Referring to FIG. 5, it is also contemplated that a single hinge can be used to transmit multiple electronic signals (such as power, data and control signals). In this embodiment, in addition to the conductive tip 52, the hinge pin 26' includes separate bands of conductive material 60 separated by insulators 62. Each conductive band 60 and the tip 52 would be attached to a separate electronic signal supply line (e.g., power L1, data L2, control signals L3). The hinge cup 22 would have conductive contacts or springs 64 at distinct locations on the inside of the cup which contact the appropriate conductive band 60. Each spring 54, 64 would be attached to a separate line 56, 66 to receive the electronic signal transmitted through the respective spring 54, 64 and connect to the appropriate component.

In the illustrated embodiment, there was only a single door 10 on the rack. However, it is contemplated that there may be two or more doors on the rack. For example, as shown in FIG. 4, there may be two doors 10A, 10B, each covering a portion of the rack 10. In addition, the present invention can be applied to covers mounted on the top, sides or back of the rack, thus permitting multiple controlled entry points.

As discussed above, having the ability to send communications to a door has multiple advantages. For example, instructions could be sent to a display screen on the door of a rack providing a service technician with detailed instruction for servicing or configuring a the particular rack.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The invention claimed is:

1. An electronics rack with an electrically controlled panel, the rack comprising:
    a base, at least four side walls and a top, the base, sidewalls and top defining an enclosure with an interior, the enclosure having at least one opening in at least one sidewall or the top for accessing the interior of the enclosure;
    at least four vertical supports attached to and extending up from the base for supporting the side walls and the top;
    at least one panel mounted to the enclosure for permitting controlled access to the interior of the enclosure;
    at least two electronically controlled hinges mounted to opposite sides of the panel, each hinge having a hinge axis about which the panel can rotate when the hinge on the opposite side of the panel is unlocked, the hinge axes of the two hinges being parallel to one another, each hinge including a hinge pin that is slidable in a housing between a retracted position and an extended position, a portion of the hinge pin extending out of the housing and into a recess in a hinge cup in the extended position, and wherein the portion of the hinge pin is substantially retracted into the housing and out of the recess in the hinge cup in the retracted position, the housing of each hinge being attached to one of either the panel or the enclosure and the hinge cup is mounted to the other of the panel or the enclosure, each hinge further including an electronically controlled drive mechanism for controlling reciprocation of the hinge pin relative to the housing;
    wherein when the hinge pins on the two hinges are in their extended position and in the recesses of the hinge cups the panel cannot be rotated about either hinge axis, and wherein when the hinge pin of one of the two hinges is in its retracted position and the hinge pin of the other of the two hinges is in its extended position, the panel can be rotated about the hinge axis of the hinge that has the hinge pin in its extended position.

2. An electronics rack according to claim 1, wherein the drive mechanism is an electronically controlled solenoid mounted to the housing.

3. An electronics rack according to claim 1, wherein the panel is a door on one of the sidewalls of the enclosure.

4. An electronics rack according to claim 1, further comprising an electronic control panel mounted on the enclosure and wired to the solenoids for controlling actuation of the solenoids.

5. An electronics rack according to claim 4, further comprising a program application stored in memory on a computing device that is remotely located from the enclosure, the computing device having a processor for running the program application, the program application configured to supply control signals wirelessly to the control panel for controlling the actuation of the solenoids.

6. An electronics rack according to claim 1, wherein the panel has an electrical device mounted thereon which is configured to receive at least one type of electrical signal selected from a group including power, data and control signals, and wherein at least one of the hinges is configured to transmit the at least one electrical signal from the hinge pin to the panel, the hinge including a first electrical lead having a first end adapted to be connected to a source for supplying the electrical signal and a second end connected to a conductive surface on the hinge pin, and a second electrical lead having a first end connected to a component of the hinge cup that is in contact with the conductive surface of the hinge pin when the hinge pin is in its extended position, and a second end connected to the electrical device.

7. An electronics rack according to claim 6, wherein at least two hinges are configured to transmit the at least one electrical signal, and wherein the electronics rack includes a switch for controlling the transmission of the electrical signals from the hinges to the electrical device.

8. An electronics rack according to claim 6, wherein there are multiple electrical devices on the panel, and wherein multiple hinges are configured to each transmit at least one electrical signal, each hinge configured to transmit the signal to an associated electrical device.

9. An electronics rack according to claim 1, wherein at least one hinges is configured to transmit two or more electrical signals selected from a group including power, data and control signals, and wherein the hinge pin includes a plurality of first electrical leads that extend through a portion of the hinge pin, each first electrical lead having an end that is attached to a band of conductive material on the surface of the hinge pin, each conductive band being separate from an adjacent conductive band by a non-conducting material, each electrical lead is adapted to transmit one of the two or more electrical signals; and wherein the hinge cup includes a plurality of second electrical leads, each of the second electrical leads having a first end connected to a conductive material positioned within the hinge cup so as to contact an associated one of the conductive surfaces of the hinge pin when the hinge pin is in its extended position.

10. An electronics rack with an electrically controlled panel, the rack comprising:
a base, at least four side walls and a top, the base, sidewalls and top defining an enclosure with an interior, the enclosure having at least one opening in at least one sidewall or the top for accessing the interior of the enclosure;
at least four vertical supports attached to and extending up from the base for supporting the side walls and the top;
at least one panel mounted to the enclosure for permitting controlled access to the interior of the enclosure;
a plurality of electronically controlled hinges, each hinge having an engaged state and a disengaged state, each hinge being attached to the enclosure and the panel for securing the panel to the enclosure when the hinge is in its engaged state, at least two of the plurality of hinges are attached to opposites sides of the panel, each hinge having a hinge axis about which the panel can rotate when the hinge is in its engaged state and the other hinge is in its disengaged state, the hinge axes of the at least two hinges being parallel to one another, each hinge including a hinge pin that reciprocates in a housing between a retracted position and an extended position, a portion of the hinge pin extending out of the housing and into a recess in a hinge cup in the extended position thereby defining the engaged state of the hinge, and wherein the portion of the hinge pin is retracted toward the housing and out of the recess in the hinge cup in the retracted position thereby defining the disengaged state of the hinge, the housing of each hinge being attached to one of either the panel or the enclosure and the hinge cup is mounted to the other of the panel or the enclosure, each hinge further including an electronically controlled solenoid mounted to the housing for controlling reciprocation of the hinge pin relative to the housing;
wherein when the at least two hinges are in their engaged state the panel cannot be rotated about either hinge axis, and wherein when one hinge of the at least two hinges is in its disengaged state and the other hinge of the at least two hinges is in its engaged position, the panel can be rotated about the hinge axis of the hinge that is in its engaged position; and
an electronic control panel mounted on the enclosure and wired to the solenoids for controlling actuation of the solenoids.

* * * * *